United States Patent [19]

Kondoh et al.

[11] 4,290,870

[45] Sep. 22, 1981

[54] PHOTOPOLYMERIZABLE COMPOSITIONS

[75] Inventors: Syunichi Kondoh; Akihiro Matsufuji; Akira Umehara, all of Asaka, Japan

[73] Assignee: Fuji Photo Film Co., Ltd., Minami-ashigara, Japan

[21] Appl. No.: 40,370

[22] Filed: May 18, 1979

[30] Foreign Application Priority Data

May 22, 1978 [JP] Japan .................................. 53-60718

[51] Int. Cl.³ .......................... C08F 2/50; G03C 1/68; G03C 1/70
[52] U.S. Cl. .......................... 204/159.15; 204/159.16; 204/159.17; 204/159.23; 204/159.24; 430/281; 430/286; 430/288; 525/256; 525/257
[58] Field of Search ...................... 204/159.23, 159.15, 204/159.16, 159.17, 159.24; 430/281, 286, 288

[56] References Cited

U.S. PATENT DOCUMENTS 3,870,524  3/1975  Watanabe et al. ............. 204/159.23

OTHER PUBLICATIONS

*Chem. Abstracts,* Kampfer et al., vol. 77, p. 41367h(1972).
*Chem. Abstracts,* Webster et al., vol. 88, p. 88–30312n.

*Primary Examiner*—Wilbert J. Briggs, Sr.
*Attorney, Agent, or Firm*—Sughrue, Rothwell, Mion, Zinn and Macpeak

[57] ABSTRACT

A photopolymerizable composition comprising (1) an addition-polymerizable compound having at least one ethylenically unsaturated double bond and (2) a photopolymerization initiator as essential components, the improvement which comprises the photopolymerization initiator comprising a combination of (a) a 5-isoxazolone represented by the general formula (1) and (b) an aromatic carbonyl compound, a dialkylamino aromatic carbonyl compound represented by any of formulae (2) to (5), a compound represented by the formula (6) or 2-(α-thioxophenetylidene)-3-methylnaphtho[1,2-d][1,3]-thiazoline:

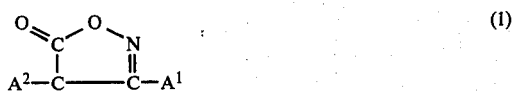

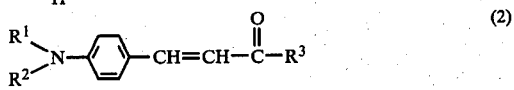

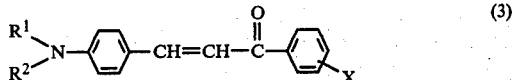

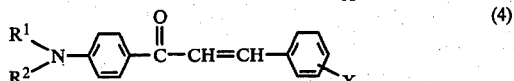

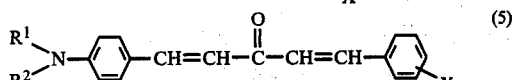

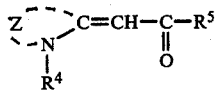 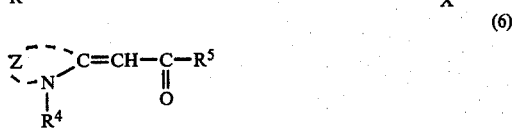

wherein in the formula (1), $A^1$ and $A^2$ each represent an alkyl group, an alkylcarbonyl group, an alkoxycarbonyl group, an aryl group, an arylcarbonyl group or a hydrogen atom and may be the same or different; in the formulae (2) to (5) $R^1$ and $R^2$ each represent an alkyl group and may be the same or different, $R^3$ represents an alkyl group, an aryl group, an aralkyl group, an alkoxy group, an aryloxy group or a 5- or 6-membered heteroaromatic ring, and X represents a substituent having a Hammett's $\sigma$ value in the range of about −0.9 to +0.7; and in the formula (6) $R^4$ represents an alkyl group, or an alkenyl group, $R^5$ represents an alkyl group, an aryl group, a thienyl group or a furyl group, and Z represents an atomic group necessaary to form a nitrogen-containing heterocyclic ring; is disclosed.

31 Claims, No Drawings

PHOTOPOLYMERIZABLE COMPOSITIONS

BACKGROUND OF THE INVENTION

1. Field of the Invention

The present invention relates to photopolymerizable compositions and more specifically to photopolymerizable compositions containing a novel photopolymerization initiator.

2. Description of the Prior Art

Hitherto, it has been widely known that unsaturated compounds capable of hardening upon exposure to actinic radiation are used as components for compositions such as coatings, printing inks or adhesives, etc., and, when electromagnetic waves such as visible light, ultraviolet radiation or X-rays, etc., or corpuscular rays such as electron beams, neutron beams or α-rays are applied to such compositions, the above-described compounds harden the compositions by polymerization and if such operation is carried out in the presence of a polymerization initiator the polymerization rate remarkably increases. For example, this is described in U.S. Pat. Nos. 3,551,235, 3,551,246, 3,551,311 and 3,558,387, Belgian Pat. No. 808,179 and Japanese Patent Application (OPI) No. 110781/74 (the term "OPI" as used herein refers to a "published unexamined Japanese patent application") (corresponding to U.S. patent application Ser. No. 328,442, filed Jan. 31, 1973) now abandon. Though products obtained by these methods have excellent flexibility, chemical resistance, abrasion resistance, luster, adhesive property and color hue, images having good quality cannot be reproduced for minute images when the operation is carried out with a slight vibration because the compositions have low sensitivity to hardening and a long period of time is required for image exposure. Furthermore, films of the compositions are easily deformed or deteriorated by the large quantity of heat generated when the radiation dosage is increased to make up for the low sensitivity of the composition.

As the result of investigations directed to increasing the sensitivity of photopolymerizable compositions, it has been found that photopolymerization initiators having a certain composition remarkably increase the photopolymerization velocity of polymerizable compounds having ethylenically unsaturated double bonds.

Though it has been described in *Eur. Polymer J.* by G. A. Delzenne, U. Laridon and H. Peeters, 6, 933 (1970) that O-acyloximes such as 1-phenyl-1,2-propanediol-2-O-benzoyloxime are effective photopolymerization initiators and in *Chemistry Letters* by M. Yoshida, H. Sakuragi, T. Nishimura, S. Ishikawa and K. Tokumaru, 1125 (1975) that the decomposition of O-acyloximes is accelerated by ketones, they do not have the sensitivity necessary for practical use. It has been found that when cyclic isoxazolones or isoxazinones are used as O-acyl ketones and combined with various other initiators, a peculiar high sensitivity is obtained.

SUMMARY OF THE INVENTION

A principal object of the present invention is to provide photopolymerization initiators and photopolymerization initiator systems having a high hardening sensitivity.

Another object of the present invention is to provide photopolymerization initiators and photopolymerization initiator systems which increase the photopolymerization velocity of photopolymerizable compositions containing a polymerizable ethylenically unsaturated compound.

Still another object of the present invention is to provide a photopolymerizable composition having high hardening sensitivity and capable of producing good image quality even in the formation of minute images.

Other objects of the present invention will be apparent from the following description of the invention.

The present invention provides photopolymerizable compositions comprising (1) an addition-polymerizable compound having at least one ethylenically unsaturated double bond and (2) a photopolymerization initiator as essential components, in which the photopolymerization initiator comprises a combination of (a) a 5-isoxazolone represented by the formula (1) and (b) an aromatic carbonyl compound, a dialkylamino aromatic carbonyl compound represented by any of the formulae (2) to (5), a compound represented by the formula (6) or 2-(α-thioxophenetylidene)-3-methylnaphtho[1,2-d][1,3]thiazoline:

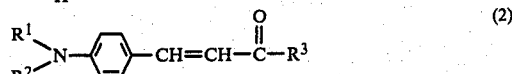

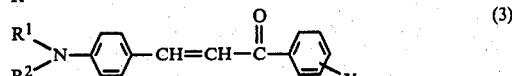

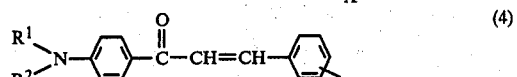

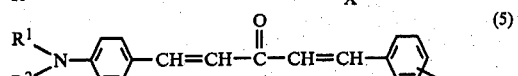

wherein in the formula (1), $A^1$ and $A^2$ each represent an alkyl group, an alkylcarbonyl group, an alkoxycarbonyl group, an aryl group, an arylcarbonyl group or a hydrogen atom and may be the same or different; in the formulae (2) to (5) $R^1$ and $R^2$ each represent an alkyl group and may be the same or different, $R^3$ represents an alkyl group, an aryl group, an aralkyl group, an alkoxy group, an aryloxy group or a nitrogen, oxygen or sulfur containing 5- or 6-membered hetero-aromatic ring, and X represents a substituent having a Hammett's σ value of about −0.9 to +0.7; and in the formula (6) $R^4$ represents an alkyl group, or an alkenyl group, $R^5$ represents an alkyl group, an aryl group, a thienyl group or a furyl group, and Z represents an atomic group necessary to form a nitrogen-containing heterocyclic ring. The present invention also relates to photopolymerizable compositions which contain an organic polymer having film-forming ability and compatibility with the components (1) and (2) as a binder.

DETAILED DESCRIPTION OF THE INVENTION

The addition-polymerizable compound having at least one ethylenically unsaturated double bond (hereafter "ethylenic compound") converts into a high molecular polymer having a linear or cross-linked structure by addition-polymerization as a function of the light decomposition products of the photopolymerization initiator when the photopolymerizable composition is exposed to actinic radiation whereby the hardness of the photopolymerizable composition increases and the solubility thereof in organic and/or inorganic solvents decreases or it is rendered completely insoluble.

Representative examples of the ethylenic compound include monomers and as well as prepolymers, i.e., dimers, trimers, tetramers and oligomers thereof with other compounds (i.e., polymers or polycondensates having a molecular weight of about 10,000 or less), mixtures thereof, copolymers thereof having a low degree of polymerization, etc. Examples of the ethylenic compound include unsaturated carboxylic acids and salts thereof, esters of unsaturated carboxylic acids and aliphatic polyhydroxy compounds (hereafter "aliphatic polyols", e.g., having 2 to 20, preferably 2 to 10 carbon atoms, and 2 to 8, preferably 2 to 6 hydroxy groups) or aromatic polyhydroxy compounds (hereafter "polyhydric phenols"), and oligoesters obtained by esterification reactions of di- or polybasic carboxylic acids, di- or polyhydroxy compounds and unsaturated carboxylic acids. A suitable range for the number of carbon atoms in the esters of the ethylenically unsaturated double bond-containing organic acids is 3 to about 20, preferably 3 to 6.

When the photopolymerizable composition is a substantially non-fluid composition at a room temperature (about 10° C. to about 40° C.), it is possible to use ethylenic compounds having a boiling point of about 100° C. or more at atmospheric pressure. When the photopolymerizable composition is a fluid composition at a room temperature, it is possible to use ethylenic compounds having a boiling point of about 30° C. or more and preferably about 40° C. to 100° C. at atmospheric pressure.

Examples of the unsaturated carboxylic acids include acrylic acid, methacrylic acid, itaconic acid, crotonic acid, isocrotonic acid and maleic acid. Examples of salts thereof are the sodium salts and potassium salts of the above unsaturated carboxylic acids.

Examples of aliphatic polyols include dihydric alcohols such as ethylene glycol, triethylene glycol, tetraethylene glycol, tetramethylene glycol, neopentyl glycol, 1,10-decanediol, 1,2-butanediol, 1,3-butanediol, propylenediol or propylene glycol, etc., trihydric alcohols such as trimethylol ethane or trimethylol propane, etc., and polymers thereof, tetra- or polyhydric alcohols such as pentaerythritol, dipentaerythritol, tripentaerythritol or other polypentaerythritols, etc., sugars such as sorbitol or d-mannitol, etc., and dihydroxycarboxylic acids such as dihydroxymaleic acid, etc.

Examples of the polyhydric phenols include hydroquinone, catechol, resorcinol, phloroglucinol and pyrogallol, etc.

Examples of esters of aliphatic polyols and unsaturated carboxylic acids include:

acrylic acid esters such as ethylene glycol diacrylate, triethylene glycol triacrylate, 1,3-butanediol diacrylate, tetramethylene glycol diacrylate, propylene glycol diacrylate, trimethylol propane triacrylate, trimethylol ethane triacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, dipentaerythritol tetraacrylate, dipentaerythritol pentaacrylate, dipentaerythritol hexaacrylate, tripentaerythritol octaacrylate, sorbitol triacrylate, sorbitol tetraacrylate, sorbitol pentaacrylate, sorbitol hexaacrylate and polyester acrylate oligomers;

methacrylic acid esters including tetramethylene glycol dimethacrylate, triethylene glycol dimethacrylate, trimethylol propane trimethacrylate, trimethylol ethane trimethacrylate, pentaerythritol dimethacrylate, pentaerythritol trimethacrylate, dipentaerythritol dimethacrylate, dipentaerythritol tetramethacrylate, tripentaerythritol octamethacrylate, ethylene glycol dimethacrylate, 1,3-butanediol dimethacrylate, tetramethylene glycol dimethacrylate and sorbitol tetramethacrylate, etc.;

itaconic acid esters such as ethylene glycol diitaconate, propylene glycol diitaconate, 1,3-butanediol diitaconate, 1,4-butanediol diitaconate, tetramethylene glycol diitaconate, pentaerythritol, diitaconate, dipentaerythritol triitaconate, dipentaerythritol, pentaitaconate, dipentaerythritol hexaitaconate and sorbitol tetraitaconate, etc.;

crotonic acid esters such as ethylene glycol dicrotonate, propylene glycol dicrotonate, tetramethylene glycol dicrotonate, pentaerythritol dicrotonate and sorbitol tetracrotonate, etc.;

isocrotonic acid esters such as ethylene glycol diisocrotonate, pentaerythritol diisocrotonate and sorbitol tetraisocrotonate, etc.;

maleic acid esters such as ethylene glycol dimaleate, triethylene glycol dimaleate, pentaerythritol dimaleate and sorbitol tetramaleate, etc.

Further, mixtures of the above-described esters are suitable.

Examples of the above-described oligoesters are oligoester acrylates and oligoester methacrylates (hereafter, oligoester (meth)acrylate means either or both the oligoester methacrylate or the acrylate).

The oligoester (meth)acrylates are reaction products obtained by esterification reactions of acrylic acid or methacrylic acid, polybasic carboxylic acids and polyols, which are compounds having a structure represented by the general formula (7):

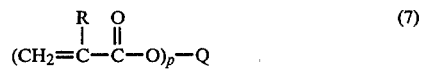

wherein R represents a hydrogen atom or a methyl group, Q represents an ester residue containing at least one ester bond composed of polyhydric alcohols and polybasic carboxylic acids, and p is an integer of 1 to 6. Suitable reaction products have a molecular weight of from about 246 to 3,000, more preferably from 284 to about 2,000. Compounds of the formula (7) are described in U.S. Pat. No. 4,050,936 and British Pat. No. 1,532,250.

As the polyols composing the ester residue Q, there are, for example, polyols such as ethylene glycol, 1,2-propylene glycol, 1,4-butanediol, 1,6-hexanediol, trimethylol propane, trimethylol ethane, 1,2,6-hexanetriol, glycerine, pentaerythritol or sorbitol, etc., and polyether polyols such as diethylene glycol, triethylene glycol, tetraethylene glycol, decaethylene glycol, tetradecaethylene glycol, polyethylene glycol, dipropylene glycol, tripropylene glycol, tetrapropylene glycol or polypropylene glycol, etc. Preferred polyethylene glycols have a molecular weight of from 60 to about 600, more preferably from 60 to about 400, and preferred polypropylene glycols have a molecular weight of from 76 to about 700, more preferably from 76 to about 500. Preferred polyhydric alcohols are aliphatic polyhydroxy compounds which contain from 2 to 30 carbon atoms, more preferably from 2 to 20 carbon atoms, and have from 2 to 6 —OH groups, more preferably from 2 to 4 —OH groups. Good results are obtained utilizing such aliphatic polyhydroxy compounds having a molecular weight of from 60 to about 700, more preferably from 60 to about 500.

On the other hand, as the polybasic acids composing the ester residue Q, there are, for example, aromatic polybasic carboxylic acids such as phthalic acid, isophthalic acid, terephthalic acid, tetrachlorophthalic acid, tetrabromophthalic acid, trimellitic acid, pyromellitic acid, benzophenone dicarboxylic acid, resorcinol diacetic acid or bisphenol A diacetic acid, etc., unsaturated aliphatic polybasic carboxylic acids such as maleic acid, fumaric acid, himic acid, tetrahydrophthalic acid, or itaconic acid, etc., saturated aliphatic polybasic carboxylic acids such as malonic acid, succinic acid, glutaric acid, adipic acid, pimelic acid, sebacic acid or dodecanoic acid, etc. Preferred polybasic acids have from 3 to 30 carbon atoms, more preferably from 4 to 20 carbon atoms (including the carboxylic carbon atom) and contain from 2 to 6 —COOH groups, more preferably from 2 to 4 —COOH groups. Such polybasic acids have a molecular weight of from 104 to about 600, with excellent results being obtained using polybasic acids having a molecular weight of from 116 to about 500.

For those polybasic acids which comprise an aromatic ring, such a ring may be substituted and, in such instance, the substituent is most preferably an alkyl group having 1 to 5 carbon atoms, a halogen (Cl, Br, I) atom or a haloalkyl group comprising an alkyl moiety having 1 to 5 carbon atoms and Cl, Br or I.

The ester residue Q includes residues which are composed of one polyol and one polybasic carboxylic acid and residues which are composed of two or more of either or both the polyol and the polybasic carboxylic acid. Further, the ester residue Q includes residues which contain one molecule of polyol and one molecule of polybasic carboxylic acid and two or more molecules of the other. Namely, any residue can be used if at least one ester bond is present in Q. Further, the ester residue Q includes residues containing hydroxyl groups and residues in which hydroxyl groups form esters with monobasic carboxylic acids or are substituted by alkoxy groups (preferably alkoxy groups having 1 to 5 carbon atoms such as methoxy or ethoxy group). Further, Q may contain carboxylic acid groups.

The value of p in the formula (7) and the number of ester bonds included in Q are generally in the range of 1 to 6. When p is 2 or more though compounds containing either the acryloyl group or the methacryloyl group may be used as well as compounds containing both a methacryloyl and an acryloyl group in a suitable ratio in one molecule may be used.

The oligoester (meth)acrylate can be easily synthesized in a yield of 80% or more by heating a solution containing acrylic acid or methacrylic acid, a polyhydric alcohol and a polybasic acid in the ratio desired in the final product at 60° to 100° C. in the presence of a thermal polymerization inhibitor such as hydroquinone, p-methoxyphenol or phenothiazine (0.1 to 0.01% by weight based on the sum total of acrylic acid and methacrylic acid) and a dehydration catalyst such as sulfuric acid or zinc chloride (0.1 to 0.01% by weight based on the sum total of acrylic acid and methacrylic acid) (see Japanese Patent Application (OPI) No. 133491/74, abstracted in *Chemical Abstracts*, 82, 172726a (1975)).

Examples of oligoester (meth)acrylates which can be used in the present invention are shown in Table 1 below. However, other various kinds of oligoester (meth)acrylates, (for example, those described in U.S. Pat. No. 3,732,107 and in Japanese Patent Application (OPI) No. 133491/74, abstracted in *Chemical Abstracts*, 82, 172726a (1975)) can be suitably used in the present invention. In Table 1, Y in the structural formula represents an acryloyl group

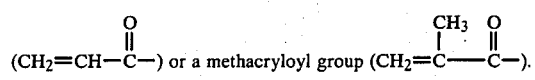

TABLE 1

Oligoester (meth)acrylates

Y—OCH₂CH₂OOC—CH=CH—COOCH₂CH₂OH

Y—OCH₂CH(CH₃)—OOC—CH₂CH₂—COO—CH(CH₃)CH₂OH

Y—O(CH₂CH₂O)₂₂OC—C₆H₄—CO(OCH₂CH₂)₂₂OH

Y(O(CH₂)₇OOC(CH₂)₇CO)₂O(CH₂)₇OOC—CH₃

Y—OCH₂CH₂OOC—C₆H₄—COOCH₂CH₂O—Y

Y(OCH₂CH₂OOC—C₆H₄—CO)₂OCH₂CH₂O—Y

Y—O(CH₂CH₂O)₃₃OC—CH=CH—CO(OCH₂CH₂)₃₃O—Y

Y—OCH₂CH₂OOC[norbornane]COOCH₂CH₂O—Y

Y((OCH₂CH₂)₃₃OOC(CH₂)₇CO)₂O(CH₂CH₂O)₃₃Y

Y((OCH₂CH₂)₂₂OOC—C₆H₄—CO)₃O(CH₂CH₂O)₂₂Y

Y(OCH₂CH₂)₁₀—OOC—CH₂—COO(CH₂CH₂O)₁₀Y

Y(OCH₂CH₂)₁₀—OOC[C₆H₃(—CO—C₆H₅)]COO(CH₂CH₂O)₁₀Y

Y—OCH₂CH₂OOC[C₆H₃]COO—CH₂CH₂—O—Y
Y—OCH₂CH₂OOC

TABLE 1-continued
Oligoester (meth)acrylates

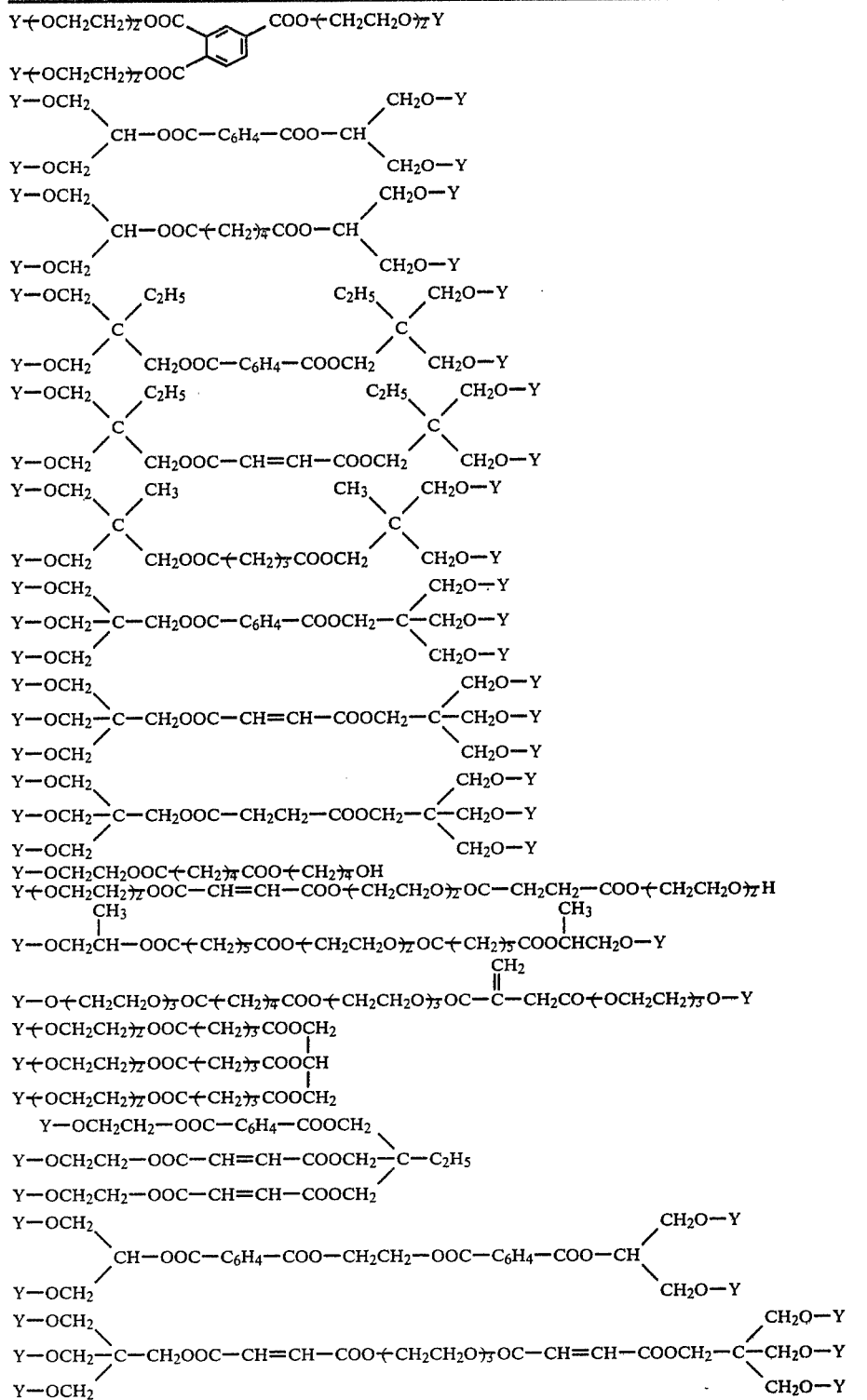

Hereafter, the photopolymerization initiator which is a characteristic feature of the photopolymerizable compositions of the present invention is explained.

The substituents $A^1$ and $A^2$ of 5-isoxazolone represented by the formula (1) of component (a) represent each an alkyl group, an alkylcarbonyl group, an aryl group, an arylcarbonyl group, an alkoxycarbonyl group or a hydrogen atom, which may be the same or different.

The alkyl group may be a straight or branched chain alkyl group having 1 to 5 carbon atoms. Examples include a methyl group, an ethyl group, a propyl group, a butyl group, a pentyl group, an isopropyl group, an isobutyl group, an isopentyl group, a sec-butyl group, a neopentyl group, a tert-butyl group, etc. Among them, the methyl group and the ethyl group are preferred.

The alkylcarbonyl group may be an alkylcarbonyl group having 2 to 6 carbon atoms. Examples include an acetyl group, a propionyl group, a butyryl group, a valeryl group, a pentyloxy group, an isobutyryl group, an isovaleryl group, a pivaloyl group, etc. Among them, the acetyl group is preferred.

The alkoxycarbonyl group may be an alkoxycarbonyl group in which the alkyl group is a straight or branched chain alkyl group having 1 to 5 carbon atoms. Examples include a methoxycarbonyl group, an ethoxycarbonyl group, a propoxycarbonyl group, a butoxycarbonyl group, a pentyloxycarbonyl group, an isopropoxycarbonyl group, an isobutoxycarbonyl group, an isopentyloxycarbonyl group, etc. Among them, the methoxycarbonyl group and the ethoxycarbonyl group are preferred.

Examples of the aryl group include a phenyl group, a p-tolyl group, an m-tolyl group and an o-tolyl group. Preferred is the phenyl group.

Examples of the arylcarbonyl group include a benzoyl group, a p-toluoyl group, an m-toluoyl group and an o-toluoyl group. The benzoyl group is preferred. Though $A^1$ and $A^2$ may be the same, it is preferred that $A^1$ and $A^2$ are not each a hydrogen atom at the same time.

Examples of 5-isoxazolones represented by the formula (1) include 3-phenyl-5-isoxazolone, 3-methyl-5-isoxazolone, 3-ethyl-5-isoxazolone, 3-acetyl-5-isoxazolone and 4-ethoxycarbonyl-5-isoxazolone. The 5-isoxazolones represented by the formula (1) can be synthesized by processes described in *Practical Heterocyclic Chemistry* written by A. O. Fitton and R. K. Smalley, p. 29 (published by Academic Press Inc., London, 1968), *Heterocyclic Compounds*, edited by R. C. Elderfield, Vol. 5 (Isoxazoles) p. 472, and *Chemistry of Carbon Compounds*, edited by E. H. Rodd, Vol. IVA (Isoxazolines and Isoxazolones), p. 343. In particular, the 5-isoxazolones can be synthesized by reacting ethyl benzoylacetate with ammonium hydroxide in the presence of sodium acetate under reflux. The compounds described above as examples are all colorless solids at room temperature.

The aromatic carbonyl compounds for component (b) are aromatic carbonyl compounds having one or two oxo-oxygen (e.g., carbonyl oxygen) atoms linked to carbon atoms in the aromatic ring and compounds having one or two oxo-oxygen atoms linked to carbon atoms which are in turn linked to a carbon atom in the aromatic ring. As the aromatic carbonyl compounds, there are aromatic acyloins, aromatic acyloin ethers, aromatic ketones and polynuclear condensed quinones. Generally these compounds contain 3 to 6 conjugated aromatic rings and up to 28 ring forming carbon atoms.

In general, these aromatic carbonyl compounds can be classified into two basic types, i.e., (I) compounds where at least one oxo-oxygen atom (=O) is bonded directly to an aromatic ring or a ring having aromatic character (such as a cycloalkadiene ring) and which can be represented by the general formula (A)

Ar=O  (A)

wherein Ar represents an aromatic moiety; such as fused polycyclic quinones (including dicyclic quinones having a naphthoquinone type structure) of the general formula (A-1) below

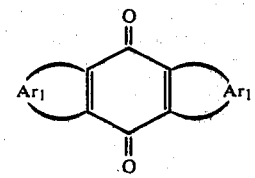

wherein $Ar_1$ represents the atoms necessary to form an aromatic ring, such as a benzene ring, or cyclic ketones of the general formula (A-2)

wherein $Ar_2$ represents the atoms necessary to complete a ring with aromatic character, such as a cycloalkadiene ring; and (II) compounds where at least one oxo-oxygen atom (=O) is bonded to a carbon atom bonded to an aromatic ring which can be represented by the general formula (B)

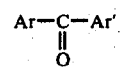

wherein Ar' is Ar,

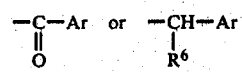

and Ar is as described above, such as benzophenones of the general formula (B-1)

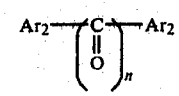

where $Ar_2$ is an aromatic moiety and n is 1; benzyls of the general formula (B-1) above where $Ar_2$ is as described above and n is 2; acyloins of the general formula (B-2) below

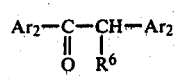

where $Ar_2$ is as described above and $R^6$ is a hydroxy group; and acyloin ethers of the general formula (B-2) above where $Ar_2$ is as described above and $R^6$ is a straight or branched chain alkoxy group having 1 to 5 carbon atoms.

Examples of the aromatic acyloins include benzoin, o-toluoin, p-toluoin, and furoin. Examples of the aromatic acyloin ethers include benzoin methyl ether, benzoin ethyl ether, benzoin isopropyl ether, benzoin sec-butyl ether, o-toluoin methyl ether and p-toluoin methyl ether.

Examples of the aromatic ketones include benzophenone, phenyl tolyl ketone, 2-chlorobenzophenone, 2- chloroacetophenone, acetophenone, propiophenone, benzil, 2,2'-dimethylbenzil, Michler's ketone, bis(p-aminophenyl)ketone, phenyl β-naphthylketone, fluorenone, anthrone, benzanthrone and 10,10'-bianthrone.

Examples of the polynuclear condensed quinones include compounds in which a benzene ring is fused with 2 or 3 benzoquinone rings, e.g., an anthraquinone, benzanthraquinone or phenanthraquinone derivative. Specific examples include anthraquinone, 1-hydroxyanthraquinone, 1-methylanthraquinone, 2-methyl-9,10-anthraquinone, 2-methylanthraquinone, 2-ethylanthraquinone, 1-chloroanthraquinone, 1-bromoanthraquinone, 2-chloroanthraquinone, phenanthraquinone, 1-methylphenanthraquinone, 4-ethylphenanthraquinone, 2-chlorophenanthraquinone, 3-bromophenanthraquinone, 2,7-dimethylphenanthraquinone, 2,7-di-tert-butylphenanthraquinone and 1,2-benzo-9,10-anthraquinone.

Among these aromatic carbonyl compounds, benzanthrone, 1,2-benzo-9,10-anthraquinone and fluorenone are preferred from the viewpoint of increased sensitivity, easiness of availability, compatibility with photopolymerizable compositions, stability to the lapse of time and fastness of formed images, etc. Particularly preferred compounds are benzanthrone, 1,2-benzo-9,10-anthraquinone and 2-methyl-9,10-anthraquinone.

The substituents $R^1$ and $R^2$ in p-dialkylamino aromatic carbonyl compounds represented by the formulae (2) to (5) represent each an alkyl group including a substituted alkyl group, which may be the same or different. The alkyl group may be a straight or branched chain alkyl group having 1 to 18 carbon atoms and cyclic alkyl groups having 5 to 18 carbon atoms. Examples include a methyl group, an ethyl group, a propyl group, a butyl group, a pentyl group, a hexyl group, a heptyl group, an octyl group, a nonyl group, a decyl group, a dodecyl group, an octadecyl group, an isopropyl group, an isobutyl group, an isopentyl group, an isohexyl group, a sec-butyl group, a neopentyl group, a tert-butyl group, a tert-pentyl group, a cyclopentyl group, a cyclohexyl group, a cycloheptyl group, a 2-norbornyl group, an α-decalyl group and a β-decalyl group. Among these, preferred are straight and branched chain alkyl groups having 1 to 10 carbon atoms and cycloalkyl groups having 6 to 10 carbon atoms.

Substituents of the substituted alkyl groups include halogen atoms (e.g., fluorine, chlorine, bromine and iodine) and a hydroxyl group. On the other hand, as the alkyl groups, there are straight, branched and cyclic alkyl groups having 1 to 18 carbon atoms and preferably 1 to 10 carbon atoms. Examples of the substituted alkyl group include a chloromethyl group, a bromoethyl group, a 2-chloroethyl group, a 2,2,2-trichloroethyl group, a 2-chloropentyl group, a 1-(chloromethyl)propyl group, a 10-bromodecyl group, an 18-methyloctadecyl group, a chlorocyclohexyl group, a hydroxymethyl group, a 2-hydroxyethyl group, a 2-hydroxybutyl group, a 5-hydroxypentyl group, a 10-hydroxydecyl group, a 2-hydroxyoctadecyl group, a 2-(hydroxymethyl)ethyl group, a hydroxycyclohexyl group and a 3-hydroxy-2-norbornyl group.

The substituent $R^3$ in the p-dialkylamino aromatic carbonyl compounds represented by the formula (2) represents an alkyl group including a substituted alkyl group, an alkoxy group, an aryl group, an aralkyl group, an aryloxy group or a nitrogen, sulfur or oxygen containing 5- or 6-membered heteroaromatic ring. Here, the alkyl group and the substituted alkyl group have the same definition as the alkyl group and the substituted alkyl group as defined above for $R^1$.

The alkoxy group may be a straight chain, branched chain or cyclic alkoxy group having 1 to 10 carbon atoms and preferably 1 to 5 carbon atoms. Examples include a methoxy group, an ethoxy group, a propoxy group, a butoxy group, a pentyloxy group, a hexyloxy group, a nonyloxy group, a decyloxy group, an isopropoxy group, a sec-butoxy group, a tert-butoxy group, an isopentyloxy group, a cyclohexyloxy group and a 2-norbornyloxy group.

The aryl group may be a monocyclic, bicyclic or tricyclic aryl group or condensed ring with a 5-membered unsaturated ring including substituted aryl groups wherein the substituents may be the same or different from one another. Examples of suitable substituents are such as a halogen atom (e.g., a fluorine atom, a chlorine atom, a bromine atom and an iodine atom), a nitro group, an amino group, a substituted amino group (e.g., mono- and dialkyl substituted amino groups (examples of the alkyl groups thereof include a methyl group, an ethyl group, a propyl group, a pentyl group, an isopropyl group, a sec-butyl group and an isopentyl group), and monoacylamino groups (examples of the acyl groups include an acetyl group, a propionyl group, a butyryl group, an isobutyryl group and a valeryl group)), a cyano group, an alkyl group (e.g., straight, branched and cyclic alkyl groups having 1 to 18 carbon atoms and, preferably, straight, branched and cyclic alkyl groups having 1 to 10 carbon atoms as have been described above), haloalkyl groups (e.g., a chloromethyl group, a 2-chloromethyl group, a 5-chloropentyl group and a trifluoromethyl group), alkoxy group (e.g., a methoxy group, an ethoxy group, a butoxy group, a pentoxy group, an isopropoxy group, an isopentoxy group, a 2-methylbutoxy group and a sec-butoxy group), aryloxy groups (e.g., a phenyloxy group, a 1-naphthoxy group and a 2-naphthoxy group), alkoxycarbonyl groups (examples of the alkyl group include a methyl group, an ethyl group, a propyl group, an isopropyl group and a butyl group), acyloxy groups (examples of the acyl groups are the same as those defined above for the monoacylamino groups) or alkoxysulfonyl groups (examples of the alkyl group are the same as those defined above for the alkoxy groups).

Examples of the aryl groups include a phenyl group, a chlorophenyl group, a nitrophenyl group, an aminophenyl group, a (methylamino)phenyl group, an (ethylamino)phenyl group, a (dimethylamino)phenyl group, an acetylaminophenyl group, a tolyl group, an ethylphenyl group, a (chloromethyl)phenyl group, an acetylphenyl group, a phenoxyphenyl group, a methoxycarbonylphenyl group, an ethoxycarbonylphenyl group, an acetoxyphenyl group, a methoxysulfonylphenyl group, a naphthyl group, a 2-amino-1-naphthyl group, a 1-dimethylamino-2-naphthyl group, a chloronaphthyl group, a methylnaphthyl group, an anthryl group, a phenanthryl group, an indenyl group, a bisphenylyl group, a chlorobiphenylyl group, an aminobiphenylyl group, a methylbiphenylyl group, an acenaphthenyl group, etc. Among them, a phenyl group and a phenyl group substituted by one or more of the above-described substituents which may be the same or different are preferred.

The aralkyl groups may contain an alkyl moiety which may be straight, branched or cyclic having 1 to 10 carbon atoms and preferably 1 to 5 carbon atoms substituted by a phenyl group or naphthyl group. Examples include a benzyl group, a phenetyl group, a 3-phenylpropyl group, a 3-phenylhexyl group, a 10-phenyldecyl group, a 4-phenylcyclohexyl group, etc.

Examples of the aryloxy groups include a mono or bicyclic aryloxy group such as a phenoxy group, a naphthyloxy group, a biphenyloxy group, etc.

Examples of the heteroaromatic ring include rings containing one to three hetero atoms such as a furyl group, a benzofuryl group, a pyrrolyl group, a pyridyl group, an indolyl group, a thienyl group, a benzothienyl group, etc.

The substitutents of p-dialkylamino aromatic carbonyl compounds represented by the formulae (3) to (5) represent substituents having the Hammett's $\sigma$ value in the range from $-0.9$ to $+0.7$. For the present specification, the Hammett's $\sigma$ value is defined in J. E. Leffler and E. Graunwald, *Rates and Equilibria of Organic Reactions*, John Wiley & Sons Inc., New York (1963). Examples include a hydrogen atom, a methyl group, an ethyl group, an isopropyl group, a tert-butyl group, a phenyl group, a trifluoromethyl group, a cyano group, an acetyl group, an ethoxycarbonyl group, a carboxyl group, a carboxylate group ($-COO^-$), an amino group, a methylamino group, a dimethylamino group, an ethylamino group, a diethylamino group, an acetylamino group, $-PO_3H$, a methoxy group, an ethoxy group, a propoxy group, an isopropoxy group, a butoxy group, a pentyloxy group, a phenoxy group, a hydroxyl group, an acetoxy group, a methylthio group, an ethylthio group, an isopropylthio group, a mercapto group, an acetylthio group, a thiocyano group ($-SCN$), a methylsulfinyl group, an ethylsulfinyl group, a methylsulfonyl group, an ethylsulfonyl group, an aminosulfonyl group, a dimethylsulfonyl group ($-S^+(CH_3)_2$), a sulfonato group ($-SO_3^-$), a fluorine atom, a chlorine atom, a bromine atom, an iodine atom, an iodyl group, a trimethylsilyl group ($-Si(CH_3)_3$), a triethylsilyl group, a trimethylstannyl group ($-Sn(CH_3)_3$), etc. Among these substituents, preferred are the hydrogen atom, the methyl group, the ethyl group, the methoxy group, the ethoxy group, the dimethylamino group, the diethylamino group, the chlorine atom, the bromine atom and the cyano group.

Examples of the compounds represented by the formula (2) are compounds containing a p-dialkylaminocinnamoyl group including p-dimethylaminostyryl methyl ketone, p-dimethylaminostyryl ethyl ketone, p-dimethylaminostyryl propyl ketone, p-dimethylaminostyryl butyl ketone, p-dimethylaminostyryl isobutyl ketone, p-diemthylaminostyryl tert-butyl ketone, p-dimethylaminostyryl cyclohexyl ketone, p-dimethylaminostyryl benzyl ketone, p-dimethylaminostyryl phenetyl ketone, methyl p-dimethylaminocinnamate, ethyl p-dimethylaminocinnamate, p-dimethylaminostyryl 2-pyridyl ketone, p-dimethylaminostyryl 4-pyridyl ketone, p-dimethylaminostyryl 2-thienyl ketone, p-dimethylaminostyryl 9-anthryl ketone, p-diethylaminostyryl methyl ketone, p-diethylaminostyryl ethyl ketone, p-diethylaminostyryl butyl ketone, etc.

Examples of the compounds represented by the formula (3) are p-dialkylaminochalcone and derivatives thereof including p-dimethylaminochalcone (i.e., p-dimethylaminostyryl phenyl ketone), p-dimethylamino-p'-cyanochalcone (i.e., p-dimethylaminostyryl p-cyanophenyl ketone; hereinafter, a symbol of position having no prime indicates a position on the benzene ring of the styryl group, and a symbol of position having a prime indicates a position of the benzene ring of the phenyl group), p-dimethylamino-p'-chlorochalcone, p-dimethylamino-m'-chlorochalcone, p-dimethylamino-p'-bromochalcone, p-dimethylamino-m'-bromochalcone, p-dimethylamino-p'-methylchalcone, p-dimethylamino-m'-methylchalcone, p-dimethylamino-p'-ethylchalcone, p-dimethylamino-m'-ethylchalcone, p-dimethylamino-p'-methoxychalcone, p-dimethylamino-m'-methoxychalcone, p-dimethylamino-p'-ethoxychalcone, p-dimethylamino-m'-ethoxychalcone, p-dimethylamino-p'-dimethylaminochalcone, p-diethylaminochalcone, p-diethylamino-p'-cyanochalcone, p-diethylamino-m'-chlorochalcone, p-diethylamino-p'-chlorochalcone, p-diethylamino-m'-bromochalcone, p-diethylamino-p'-bromochalcone, p-diethylamino-m'-methylchalcone, p-diethylamino-p'-methylchalcone, p-diethylamino-m'-ethylchalcone, p-diethylamino-p'-ethylchalcone, p-diethylamino-p'-ethoxychalcone, p-diethylamino-m'-methoxychalcone, p-diethylamino-p'-diethylaminochalcone, etc.

Examples of compounds represented by the formula (4) are chalcone derivatives including p'-dimethylaminochalcone (i.e., p-dimethylaminophenyl styryl ketone), p-cyano-p'-dimethylaminochalcone (i.e., p-cyanophenyl p-dimethylaminostyryl ketone) (the positional symbols have the same meaning as described above); p-chloro-p'-dimethylaminochalcone, m-chloro-p'-dimethylaminochalcone, m-bromo-p'-dimethylaminochalcone, p-bromo-p'-dimethylaminochalcone, m-methyl-p'-dimethylaminochalcone, p-methyl-p'-dimethylaminochalcone, m-ethyl-p'-dimethylaminochalcone, p-ethyl-p'-dimethylaminochalcone, m-methoxy-p'-dimethylaminochalcone, p-methoxy-p'-dimethylaminochalcone, m-ethoxy-p'-dimethylaminochalcone, p-ethoxy-p'-dimethylaminochalcone, p,p'-bis(dimethylamino)chalcone, p,p'-bis(diethylamino)chalcone, p'-diethylaminochalcone, p-cyano-p'-diethylaminochalcone, p-chloro-p'-diethylaminochalcone, m-bromo-p'-diethylaminochalcone, p-chloro-p'-diethylaminochalcone, p-ethyl-p'-diethylaminochalcone, m-ethyl-p'-diethylaminochalcone, p-methoxy-p'-diethylaminochalcone, m-ethoxy-p'-diethylaminochalcone, etc.

Examples of the compounds represented by the formula (5) are p-dialkylsytyrl styryl ketone derivatives including p-dimethylaminostyryl p-cyanostyryl ketone, p-dimethylaminostyryl p-chlorostyryl ketone, p-dimethylaminostyryl m-chlorostyryl ketone, p-dimethylaminostyryl p-bromostyryl ketone, p-dimethylaminostyryl m-bromostyryl ketone, p-dimethylaminostyryl styryl ketone, p-dimethylaminostyryl m-methylstyryl ketone, p-dimethylaminostyryl p-methylstyryl ketone, p-dimethylaminostyryl p-ethylstyryl ketone, p-dimethylaminostyryl m-ethylstyryl ketone, p-dimethylaminostyryl p-methoxystyryl ketone, p-dimethylaminostyryl m-methoxystyryl ketone, p-dimethylaminostyryl p-ethoxystyryl ketone, bis(p-dimethylaminostyryl)ketone, p-diethylaminostyryl p-cyanostyryl ketone, p-diethylaminostyryl p-bromostyryl ketone, p-diethylaminostyrl m-chlorostyryl ketone, p-diethylaminostyryl styryl ketone, p-diethylaminostyryl p-methylstyryl ketone, p-diethylaminostyryl m-ethylstyryl ketone, p-diethylaminostyryl p-methoxystyryl ketone, p-diethylaminostyryl m-ethoxystyryl ketone, bis(p-diethylaminostyryl)ketone, etc.

Among the above-described compounds represented by the formulae (2) to (5), compounds preferably used in the present invention are as follows:

Preferred compounds represented by the formula (2) are p-dimethylaminostyryl methyl ketone, p-dimethylaminostyryl ethyl ketone, p-dimethylaminostyryl propyl ketone, p-dimethylaminostyryl butyl ketone, p-dimethylaminostyryl isobutyl ketone, p-dimethylaminostyryl tert-butyl ketone, p-dimethylaminostyryl cyclohexyl ketone, p-dimethylaminostyryl benzyl ketone, p-dimethylaminostyryl phenetyl ketone, methyl p-dimethylaminocinnamate, ethyl p-dimethylaminocinnamate, p-dimethylaminostyryl 2-pyridyl ketone, p-dimethylaminostyryl 4-pyridyl ketone, p-dimethylaminostyryl 2-thienyl ketone, and p-dimethylaminostyryl 9-anthryl ketone.

Preferred compounds represented by the formula (3) are p-dimethylaminochalcone, p-dimethylamino-m'-chlorochalcone, p-dimethylamino-p'-chlorochalcone, p-dimethylamino-m'-bromochalcone, p-dimethylamino-p'-bromochalcone, p-dimethylamino-p'-cyanochalcone, p-dimethylamino-p'-methoxychalcone, p-dimethylamino-p'-methylchalcone, p-dimethylamino-m'-methylchalcone, p-dimethylamino-p'-ethylchalcone, p-dimethylamino-m'-ethylchalcone, p-diethylamino-p'-bromochalcone, p-diethylamino-m'-bromochalcone, p-diethylamino-p'-chlorochalcone and p-diethylamino-m'-chlorochalcone.

Preferred compounds represented by the formula (4) are p'-dimethylaminochalcone, p-cyano-p'-dimethylaminochalcone, m-chloro-p'-dimethylaminochalcone, p-chloro-p'-dimethylaminochalcone, m-bromo-p'-dimethylaminochalcone, p-bromo-p'-dimethylaminochalcone, m-methyl-p'-dimethylaminochalcone, p-methyl-p'-dimethylaminochalcone, p-ethyl-p'-dimethylaminochalcone, m-ethyl-p'-dimethylaminochalcone, p-ethyl-p'-dimethylaminochalcone, p-methoxy-p'-dimethylaminochalcone and p,p'-bis(dimethylamino)chalcone.

Preferred compounds represented by the formula (5) are p-dimethylaminostyryl p-methylstyryl ketone, p-dimethylaminostyryl p-ethylstyryl ketone, p-dimethylaminostyryl p-chlorostyryl ketone, p-dimethylaminostyryl m-chlorostyryl ketone, p-dimethylaminostyryl p-bromostyryl ketone, p-dimethylaminostyryl m-bromostyryl ketone, p-dimethylaminostyryl p-methoxystyryl ketone, p-dimethylaminostyryl p-ethoxystyryl ketone, p-dimethylaminostyryl p-cyanostyryl ketone, p-dimethylaminostyryl m-methylstyryl ketone, p-dimethylaminostyryl m-ethylstyryl ketone, bis(p-dimethylaminostyryl)ketone and bis(p-diethylaminostyryl)ketone.

The above-described p-dialkylamino aromatic carbonyl compounds represented by the formulae (2) to (5) can be synthesized according to the process by P. Pfeiffer and O. Angen described in *Justus Liebigs Annalen der Chemie*, Vol. 44, pp. 228–265 (1925), the process by B. N. Dashkevich and I. V. Smolanka described in *Ukrain. khim. Zhur.*, Vol. 21, pp. 619–624 (1955) and the process by I. V. Smedanka described in *Nauch. Zapjski. Uzhgrod. Univ.*, Vol. 18, pp. 15–19 (1957). For example, p-dimethylaminostyryl propyl ketone can be synthesized by a condensation reaction (Perkin reaction) of p-dimethylaminobenzaldehyde and propyl ethyl ketone, and p-dimethylaminochalcone can be synthesized by a condensation reaction (Perkin reaction) of p-dimethylaminobenzaldehyde and phenyl methyl ketone.

In compounds represented by the formula (6), $R^4$ represents an alkyl group including a substituted alkyl group or an alkenyl group which are encountered in conventional cyanine dyes. Examples of the alkyl group include a methyl group, an ethyl group, a propyl group, an isopropyl group, etc. Examples of the substituted alkyl group include a hydroxymethyl group, a 2-hydroxyethyl group, a 3-hydroxypropyl group, a methoxymethyl group, a 2-methoxyethyl group, a carboxymethyl group, a 2-carboxyethyl group, a 3-carboxypropyl group, a sulfomethyl group, a 2-sulfoethyl group, a 3-sulfopropyl group, a methoxycarbonylmethyl group, a 2-(methoxycarbonyl)ethyl group, a benzyl group, a phenetyl group, a p-sulfobenzyl group, a p-sulfophenetyl group, a p-carboxybenzyl group, a p-carboxyphenetyl group, etc. Examples of the alkenyl group include a vinyl group, an allyl group, a 1-propenyl group, an isopropenyl group, etc.

$R^5$ represents an alkyl group, an aryl group, a thienyl group or a furyl group. Examples of the alkyl group include a methyl group, an ethyl group, a propyl group and an isopropyl group. Examples of the aryl group include a phenyl group, an α-naphthyl group, a β-naphthyl group, etc. The aryl group may be a substituted aryl group such as a p-hydroxyphenyl group, a p-methoxyphenyl group, a p-ethoxyphenyl group, a p-chlorophenyl group, a p-bromophenyl group, a p-(dimethylamino)phenyl group, a p-(diethylamino)phenyl group, etc. The thienyl group or the furyl group may be substituted. Suitable examples of substituents for the thienyl or furyl group include an alkyl group having 1 to 3 carbon atoms (e.g., a methyl group, an ethyl group or an isopropyl group), a halogen atom (e.g., a fluorine atom, a chlorine atom or a bromine atom), and the like.

Z represents an atomic group necessary to form a nitrogen containing heterocyclic ring. Z may contain up to 3 hetero atoms (Se, S, O), however, preferably contains only one of O, Se or S. More specifically, Z can represent a divalent residue consisting of carbon atoms and hydrogen atoms, a divalent residue consisting of one of a sulfur, selenium or oxygen atom, carbon atoms and hydrogen atoms which may be substituted. Examples of the above-described nitrogen containing heterocyclic ring include benzothiazoles (e.g., benzothiazole, 5-chlorobenzothiazole, 6-chlorobenzothiazole, 4-methylbenzothiazole, 6-methylbenzothiazole, 5-phenylbenzothiazole, 6-methoxyenzothiazole, 4-ethoxybenzothiazole, 5-methoxybenzothiazole, 5-hydroxybenzothiazole, 5,6-dimethylbenzothiazole, 5,6-dimethoxybenzothiazole, etc.), naphthothiazoles (e.g., α-naphthothiazole, β-naphthothiazole, etc.), benzoselenazoles (e.g., benzoselenazole, 5-chlorobenzoselenazole, 6-methylbenzoselenazole, 6-methoxybenzoselenazole, etc.), naphthoselenazoles (e.g., α-naphthoselenazole, β-naphthoselenazole, etc.), benzoxazoles (e.g., benzoxazole, 5-methylbenzoxazole, 5-phenylbenzoxazole, 6-methoxybenzoxazole, etc.), naphthoxazoles (e.g., α-naphthoxazole, β-naphthoxazole, etc.), thiazoles (e.g., 1,3-thiazole, 4,5-diphenyl-1,3-thiazole, etc.), and indolines (e.g., indoline, 3,3-dimethylindoline, 3,3-diethylindoline, 3-methylindoline, 3-ethylindoline, etc.).

Of the foregoing nitrogen containing heterocyclic rings, those rings in which Z completes a benzothiazole, a benzoxazole, an α- or β-naphthothiazole or naphthoxazole, or a chlorine, methyl, ethyl, methoxy, etc., substituted benzothiazole or benzoxazole ring are particularly suitable Some compounds represented by the formula (6) are described in Japanese Patent Application (OPI) No.

108192/74 (corresponding to U.S. Pat. No. 3,870,524), U.S. Pat. No. 2,948,610 and German Patent Application (OLS) No. 2,012,390. Examples of the compounds represented by the formula (6) include the following:

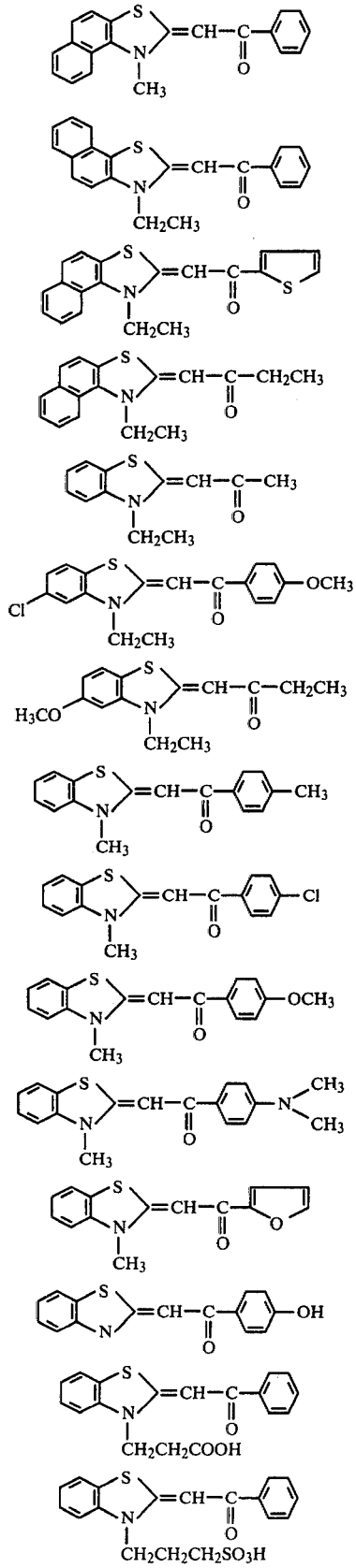

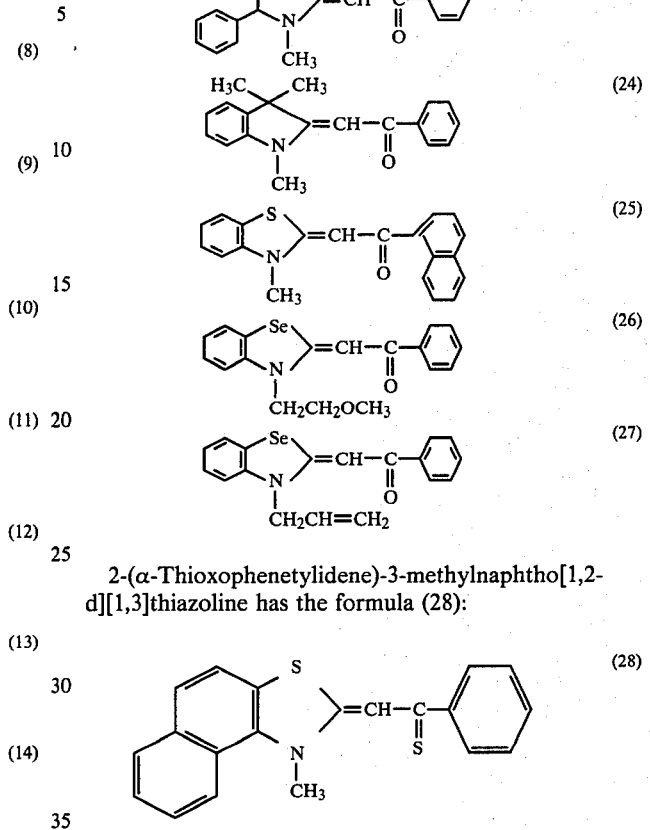

2-(α-Thioxophenetylidene)-3-methylnaphtho[1,2-d][1,3]thiazoline has the formula (28):

The photopolymerization initiator contained in the photopolymerizable compositions of the present invention is composed of a combination of the above-described compounds (a) and (b). For any compound (b), the ratio by weight of the (b) to (a) by which the effect of the present invention is remarkably exhibited is about 1:30 to about 30:1 and preferably about 1:10 to about 10:1.

In the photopolymerizable compositions of the present invention, the photopolymerization initiator may be present in an amount of about 0.1% to 20% and preferably about 0.2% to 10% based on the weight of the ethylenic compound (1).

The photopolymerizable compositions of the present invention are mixtures comprising the above-described ethylenic compound and the above-described photopolymerization initiator as essential components. However, in case of affording high film-forming ability to the photopolymerizable compositions, in case of affording film-forming ability to a composition which is liquid at a room temperature (the range from about 10° C. to about 40° C.) or in case of increasing the viscosity of the photopolymerizable composition, the composition may contain a polymer compatible with the ethylenic compound and the photopolymerization initiator and having film-forming ability in the photopolymerizable composition, as a binder.

As described below, it is preferred to use polymers having film-forming ability in photopolymerizable compositions which are used in forming resist images in sensitive materials such as sensitive materials which are stripping or solvent developable.

Although any polymeric material can be used as the binder as long as it is compatible with the ethylenic compound and the photopolymerization initiator, it is preferred to select materials capable of development by stripping, by water or by a weak aqueous alkali solution. Namely, the polymeric material is used not only as a film-forming agent for the compositions but also as having affinity for water, weak aqueous alkali solutions or organic solvents used as developing solutions.

For example, if a water-soluble polymeric material is used, development by water can be carried out. As such polymeric materials, there are addition-polymers having a carboxyl group in the side chains, for example, methacrylic acid copolymers, acrylic acid copolymers, itaconic acid copolymers, partially esterified maleic acid copolymers, maleic acid copolymers and crotonic acid copolymers, etc., and acid cellulose derivatives having a carboxyl group in the side chains. Further, hydroxyl group containing addition-polymers to which cyclic acid anhydride is added are suitably used. In addition, polyvinyl pyrrolidone and polyethylene oxide are suitably used as water-soluble polymers. Further, in order to increase film strength of areas hardened by exposure, alcohol-soluble nylon and polyether of 2,2-bis(4-hydroxyphenyl)propane and epichlorohydrin are suitably used. These materials can be incorporated in a suitable amount based on the entire composition (exclusive of solvents). However, in amounts above 90% by weight, preferred results in terms of image strength are not obtained.

As linear polymeric materials used for photopolymerizable compositions which are stripping developable, there are chlorinated polyolefins (chlorine content: about 60% by weight to about 75% by weight) such as chlorinated polyethylene or chlorinated polypropylene, etc., and homopolymers and copolymers such as polymethyl methacrylate, polyacrylic acid, polymethacrylic acid, polyacrylic acid alkyl esters (examples of the alkyl group include a methyl group, an ethyl group and a butyl group), copolymers of acrylic acid alkyl ester and at least one monomer selected from acrylonitrile, vinyl chloride, vinylidene chloride, styrene and butadiene, polyvinyl chloride, vinyl chloride-acrylonitrile copolymer, polyvinylidene chloride, vinylidene chloride-acrylonitrile copolymer, polyvinyl acetate, vinyl acetate-vinyl chloride copolymer, polyvinyl alcohol, polyvinyl pyrrolidine, polyacrylonitrile, acrylonitrile-styrene copolymer, acrylonitrile-butadiene-styrene terpolymer, polyvinyl alkyl ethers (examples of the alkyl group include a methyl group, an ethyl group, an isopropyl group, and a butyl group), polymethyl vinyl ketone, polyethyl vinyl ketone, polyethylene, polypropylene, polybutene, polystyrene, poly-$\alpha$-methylstyrene, polyamides (6-nylon or 6,6-nylon, etc.), poly-1,3-butadiene, polyisoprene, polyurethane, polyethylene terephthalate, polyethylene isophthalate, chlorinated rubber, polychloroprene, ethylcellulose, acetylcellulose, polyvinyl butyral, polyvinyl formal, styrenebutadiene rubber or chlorosulfonated polyethylene, etc. In case of copolymers, though a ratio of monomers may be varied in a wide range, it is generally preferred that the ratio by mol of the minor monomer component is in the range of 10% to 50%. Further, thermoplastic high molecular substances other than the above-described substances can be used in the present invention, if they satisfy the compatibility condition.

Among the above-described polymers, those preferably used together with the photopolymerizable compositions of the present invention are chlorinated polyethylene (chlorine content: about 60% to 75% by weight), chlorinated polypropylene (chlorine content: about 60% to 75% by weight), polymethyl methacrylate, polyvinyl chloride, vinyl chloride-vinylidene chloride copolymer (molar ratio of vinyl chloride about 20 to 80%), vinylidene chloride-acrylonitrile copolymer (molar ratio of acrylonitrile about 10 to 30%), vinyl chloride-acrylonitrile copolymer (molar ratio of acrylonitrile about 10 to 30%), polystyrene, polyvinyl butyral, polyvinyl acetate, polyvinyl formal, ethylcellulose, acetylcellulose, vinyl chloride-vinyl acetate copolymer, polychloroprene, polyisoprene, chlorinated rubber and chlorosulfonated polyethylene.

Although the polymeric materials may be used alone, two or more of them may be used in a suitable ratio so as not to cause separation during production steps comprising preparation of coating solutions, application thereof and drying.

The above-described polymers are incorporated as the binder in the photopolymerizable compositions of the present invention, an amount by weight of generally about 10% to 500% and preferably about 20% to 200% based on the weight of the ethylenic compound, though a range of forming excellent images varies with each polymer.

Known additives such as thermal polymerization inhibitors, plasticizers, coloring agents, surface smoothing agents or surface protecting agents, etc., may be added to the photopolymerizable compositions of the present invention, if necessary.

Examples of the thermal polymerization inhibitors include p-methoxyphenol, hydroquinone, alkyl- or aryl-substituted hydroquinones, t-butylcatechol, pyrogallol, phenothiazine, chloranil, naphthylamine, $\beta$-naphthol, 2,6-di-t-butyl-p-cresol, pyridine, nitrobenzene, dinitrobenzene, p-toluidine, etc. These thermal polymerization inhibitors can be contained in an amount of about 0.001% to 5% and preferably about 0.01% to 3% based on the weight of the ethylenic compound. The thermal polymerization inhibitors improve stability of the photopolymerizable compositions of the present invention to the lapse of time before use (before exposure to light).

As the coloring agents, there are pigments such as titanium oxide, carbon black, iron oxide, phthalocyanine pigments or azo pigments, etc., and dyes such as Methylene Blue, Crystal Violet, Rhodamine B, Fuchsine, Auramine, azo dyes or anthraquinone dyes, etc. However, it is preferred that the coloring agents used do not absorb light having absorption wavelengths of the photopolymerization inhibitor. The coloring agents are preferably added in an amount, based on a total of 100 parts by weight of the ethylenic compound and the photopolymerization inhibitor, of 0.1 part by weight to 30 parts by weight in case of pigments and from 0.01 part by weight to 10 parts by weight and, preferably from 0.1 part by weight to 10 parts by weight in case of dyes. In case of incorporating the above-described coloring agents, it is preferred to use dichloromethyl stearate or other chlorinated aliphatic acids as a supplemental material for coloring agents, which can be used in an amount of from 0.005 part by weight to 0.5 part by weight based on 1 part by weight of the coloring agents. But in cases where plasticizers are contained in the photopolymerizable compositions, the supplemental material is not necessary. As plasticizers, there are phthalic acid esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate, etc., glycol esters such as dimethylglycol phthalate, ethylphthalyl ethyl glycolate, methylphthalyl ethyl glycolate, butylphthalyl butyl glycolate or triethylene glycol dicaprylate, etc., phosphoric acid esters such as tricresyl phosphate or triphenyl phosphate, etc., aliphatic dibasic acid esters such as diisobutyl adipate, dioctyl adipate, dimethyl sebacate, dibutyl sebacate, dioctyl azelate or dibutyl maleate, etc., triethyl citrate, glycerine triacetyl ester and butyl laurate. As the surface smoothing agents, there are lanolin, paraffin wax, natural wax, etc.

Surface protecting agents are materials which have poor compatibility with the photopolymerizable composition and, consequently, are separated on the surface of the photopolymerizable composition layer as layer, discontinuous islands or particle form, by which the surface of the photopolymerizable composition layer is protected. They also function to prevent polymerization inhibition by oxygen in the air. As the surface protecting agents, there are polystyrene, aliphatic carboxylic acids having 12 or more carbon atoms and amides thereof. Examples of the aliphatic carboxylic acids having 12 or more carbon atoms include lauric acid, myristic acid, palmitic acid, stearic acid, nonadecanoic acid, arachic acid, behenic acid, cerotic acid, heptacosanoic acid, montanic acid, melissic acid, lacceric acid, etc. Examples of aliphatic acid amides having 12 or more carbon atoms include amides of the above-described aliphatic acids.

The above-described various additives can be used in an amount of up to about 3% by weight and preferably up to about 1% by weight based on the whole weight of the photopolymerizable composition (exclusive of solvents).

The most general way of using the photopolymerizable compositions of the present invention is that they are used as photopolymerizable photosensitive materials which are prepared by dissolving the photopolymerizable composition in a solvent to produce a solution thereof, applying it to a base by the known method, and removing the solvent (drying).

As the solvents, there are ketones such as acetone, methyl ethyl ketone, methyl isobutyl ketone, cyclohexanone or diisobutyl ketone, etc., esters such as ethyl acetate, butyl acetate, amyl acetate, methyl formate, ethyl propionate, dimethyl phthalate or ethyl benzoate, etc., aromatic hydrocarbons such as toluene, xylene, benzene or ethylbenzene, etc., halogenated hydrocarbons such as carbon tetrachloride, trichloroethylene, chloroform, 1,1,1-trichloroethane, monochlorobenzene or chloronaphthalene, etc., ethers such as tetrahydrofuran, diethyl ether, ethylene glycol monomethyl ether or ethylene glycol monoethyl ether acetate, etc., dimethylformamide and dimethyl sulfoxide.

As bases to which the photopolymerizable composition of the present invention is applied in a suitable form (for example, the above-described solution), there are flat materials which do not undergo remarkable dimensional change and materials having other shapes. Examples of the flat materials include glass, silicon oxide, ceramics, paper, metals, for example, aluminium, zinc, magnesium, copper, iron, chromium, nickel, silver, gold, platinum, palladium, alloys comprising aluminium as the principal component, alloys comprising zinc as the principal component, alloys comprising magnesium as the principal component, copper-zinc alloy, iron-nickel-chromium alloy and alloys comprising copper as the principal component, metal compounds, for example, aluminium oxide, tin oxide ($SnO_2$) and indium oxide ($In_2O_3$) and polymers, for example, regenerated cellulose, cellulose nitrate, cellulose diacetate, cellulose triacetate, cellulose acetate butyrate, cellulose acetate propionate, polystyrene, polyethylene terephthalate, polyethylene isophthalate, polycarbonate of bisphenol A, polyethylene, polypropylene, nylons (6-nylon, 6,6-nylon and 6,10-nylon etc.), polyvinyl chloride, vinyl chloride-vinyl acetate copolymer, vinyl chloride-acrylonitrile copolymer, vinyl chloride-vinylidene chloride copolymer, polyacrylonitrile, polymethyl acrylate and polymethyl methacrylate. Further, it is possible to use laminates composed of two or more thin layer of the above-described materials, for example, cermet, iron-aluminium laminated plates, iron-copper-aluminium laminated plates, iron-chromium-copper laminated plates, paper the surface of which is coated with polyethylene, paper the surface of which is coated with cellulose triacetate, aluminium plates having an aluminium oxide layer on the surface thereof which are obtained by anodic oxidation, chromium plates having a chromium oxide layer on the surface thereof which are obtained by the known method, glass plates having a thin oxide layer on the surface thereof and silicon oxide plates having an indium oxide layer on the surface thereof, as the base.

The bases may be transparent or opaque according to the purpose of the photosensitive image-forming material. In the case of transparent bases, it is possible to use not only colorless transparent bases but also colored transparent bases prepared by adding dyes or pigments as described in *J. SMPTE*, Vol. 67, p. 296 (1958). In case of opaque bases, it is possible to use not only essentially opaque bases such as paper or metal but also bases prepared by adding dyes or pigments such as titanium oxide to transparent materials, plastic films the surface of which is processed by the process described in Japanese Patent Publication No. 19068 (corresponding to British Pat. No. 1,237,475) and completely light-interceptive paper and plastic films prepared by adding carbon black. Further, it is possible to use bases having fine hollows on the surface which are prepared by processing such as sanding, electrolytic etching, anodic oxidation or chemical etching, etc., and bases the surface of which was subjected to a preliminary treatment such as corona discharging, ultraviolet ray application or flame treatment, etc. Moreover it is possible to use plastic bases in which reinforcing agents such as glass fibers, carbon fibers, boron fibers, metal fibers or metal whiskers are mixed to improve strength.

The bases may have, if necessary, another coating layer in order to improve adhesion, an antihalation layer, an ultraviolet ray absorbing layer or a visible ray absorbing layer on the surface thereof.

Further, in order to prevent deterioration of sensitivity of the compositions of the invention by oxygen, it is possible that exposing to light is carried out using a vacuum printing frame described in U.S. Pat. No. 3,060,026, or a removable transparent cover is provided or a coating layer having a low oxygen permeability is provided on the photosensitive layer as described in Japanese Patent Publication No. 17828/65 (corresponding to U.S. Pat. No. 3,203,805).

Factors for defining the rate of hardening of the photopolymerizable compositions in the present invention by photopolymerization include the base and, particularly, the surface properties thereof, the specific components in the composition, the amount of the photopolymerization initiator in the composition, the thickness of the photopolymerizable composition layer, the light source (characteristic of radiation spectra), intensity, the presence or absence of oxygen and the temperature of environment, etc.

Exposure to light may be carried out by any suitable method or a combination of methods. For example, the composition may be exposed to actinic radiation from any light source, if an effective exposure is applied. The photopolymerizable compositions of the present invention are generally highly sensitive in the region of ultraviolet radiation and visible light from about 180 nm to about 450 nm wavelength, or from about 180 nm to about 540 nm of the wavelength if a suitable dialkylamino aromatic carbonyl compound is chosen as component (b) in the photopolymerization initiator. However, since the compositions of the present invention are sensitive to vacuum ultraviolet radiation (ultraviolet radiation in the region from about 1 nm to about 180 nm of the wavelength), X rays, electromagnetic waves having short wavelengths in the range of γ-rays, and corpuscular rays such as electron beams, neutron beams or α-rays, etc., these forms of radiation can also be utilized for image exposure. Examples of suitable light sources in the ultraviolet region and visible region include carbon arc lamps, mercury vapor lamps, xenon lamps, fluorescent lamps, argon glow discharge tubes, flood lamps for photography, Van de Graaff accelerators, etc.

The light exposure time should be sufficient to afford an effective exposure amount. Though exposure may be carried out at a suitable temperature, it is the most suitable to expose at room temperature, namely, 10° C. to 40° C., for practical resons.

The compositions of the present invention hardened by light are dry and elastic and show abrasion resistance and chemical resistance. Further, they have an excellent ink-receiving property, hydrophilic-hydrophobic equilibrium, stain dissolving property and initial roll-up property (the number of printing before a practicable print is obtained) and have availability as previously sensitized printing materials for lithography and photoresist, etc. Of course, the compositions of the present invention can be used for printing inks, adhesives for metal foils, films, paper or fabrics, etc., light-hardenable coating for metal, plastics, paper, wood, metal foils, fabrics, glass, thick paper and thick paper for boxes, road marking, parking places, air ports, etc.

In case that the compositions of the present invention are used, for example, as vehicles for printing inks, they can be colored by dyes and at the same time by various known pigments such as molybdate orange, titanium white, chrome yellow, phthaloycanine blue, carbon black, etc. Further, a suitable amount of the vehicle is in the range of from about 20% to 99.9% based on the weight of the composition. The coloring agents can be used in an amount of about 0.1% to 80% by weight. The printing materials include clay coated paper and thick paper for box making.

The compositions of the present invention are suitable for processing fabrics of natural fibers and synthetic fibers, too. For example, they can be used in vehicles of printing inks for cloth, or in vehicles for special fabric treatment, such as for water-proofing, an oil resisting property, an anti-stain property or an anti-creasing property, etc.

When the compositions of the present invention are used as adhesives, at least one of articles to be bonded must be transparent to ultraviolet radiation or visible light. Typical examples of laminates obtained by bonding with using the compositions of the present invention include cellophane coated with a polymer, for example, cellophane coated with polypropylene, metal such as aluminium or copper which is covered with a polyethylene terephthalate film and aluminium which is coated with polypropylene.

The photopolymerizable compositions of the present invention can be used as coatings for application to or printing on the surface of metal, glass or plastic articles by a roll method and a spray method. Further, a colored coating method may be used for glass, polyester films, vinyl polymer films, polymer coated cellophane, treated or untreated polyethylene or treated or untreated polypropylene used for cups which are thrown away after use or bottles. Examples of metal to be coated include tin plates optionally subjected to sizing.

The photopolymerizable photosensitive image-forming materials prepared using the photopolymerizable compositions of the present invention are materials which have a photosensitive layer composed of the composition of the present invention on the surface of a sheet or plate base.

As one type of the photosensitive image-forming material using the composition of the present invention, there is a material which comprises a layer of the composition of the present invention provided on the surface of a base and a transparent plastic film overlying the layer. The transparent plastic film is stripped from materials having this structure before image exposure. Further, they can be particularly advantageously used as so-called stripping development type sensitive materials where they are imagewise exposed through the transparent plastic film or through the base when the base is transparent, and the transparent plastic film is then removed by stripping, whereby the hardened portions of the layer which were polymerized by exposure remain on the base and the unhardened portions which were not exposed remain on the transparent plastic film or vice versa.

In the photosensitive image-forming materials using the compositions of the present invention, the image exposure concludes by exposing specified parts of the layer of photopolymerizable composition till the addition polymerization reaction in the exposed parts is finished at the desired thickness. Then the unexposed parts of the composition layer are removed using a solvent which does not dissolve the polymer but dissolves only the unpolymerized ethylenic compounds (monomers or oligomers) or by so-called stripping development. In case of using the composition for the photosensitive image-forming materials, the thickness of the photopolymerizable composition after removal by the solvent (drying) is in a range from about $0.5\mu$ to about $150\mu$ and preferably from about $2\mu$ to about $100\mu$. The flexibility decreases as the thickness of the layer increases, while the abrasion resistance decreases as the thickness of the layer decreases.

In case of using as printing inks, coating compositions and adhesives, the compositions of the present invention can be used without using volatile solvents. In these cases, they have several excellent characteristics as compared with known oil-containing resin type or solvent type inks or coatings.

In the photopolymerizable compositions of the present invention, it is possible to obtain those having a high sensitivity to radiation having wavelengths from about 180 nm to about 540 nm by choosing a suitable compound from dialkylamino aromatic carbonyl compounds as component (b) of the photopolymerization initiator. Further, since the photopolymerization initiator used in the present invention has always a high sensitivity to radiation having wavelengths from about 180 nm to at least about 450 nm, it is possible to use not only high pressure mercury lamps, ultra-high pressure mercury lamps, high pressure xenon-mercury lamps, high pressure xenon lamps, halogen lamps and fluorescent lamps used for the prior photopolymerizable compositions but also argon lasers having 488 nm and 514.5 nm wavelength, which makes the compositions of the present invention superior to prior photopolymerizable compositions. Particularly, since exposure by scanning can be carried out using the argon laser, they have very wide applications. Further, the photopolymerizable compositions of the present invention have a very high photopolymerization velocity, namely, a high sensitivity, because the photopolymerization initiator composed of a combination of easily available compounds is used. Further, since the above-described photopolymerization initiator generally affords a high photopolymerization velocity to all polymerizable compounds having ethylenically unsaturated double bonds, the compositions of the present invention have wide applications and can be used as photosensitive layers of sensitive materials in various fields. For example, for production of printed circuited boards in the electronic industry, for production of lithographic, gravure or relief printing plates or for reproduction of images, etc. Accordingly, the present invention is very useful.

In the following, the present invention is illustrated in detail with reference to Examples 1 to 28 and Comparative Examples 1 to 24. Preparation of the photosensitive materials in each example is carried out in the following manner and operation.

(1) Preparation of Photosensitive Material

| Photopolymerizable Composition: | parts by weight |
|---|---|
| Pentaerythritol trimethacrylate (ethylenic compound) | 50 |
| Photopolymerization initiator (compounds described in Tables 2 to 5) | 5 |
| Binder (chlorinated polyethylene* or polymethyl methacrylate**) | 45 |
| Dichloroethane (solvent) | 500 |

*Chlorinated polyethylene: high molecular compound having a viscosity of about 90 cps at 25° C. in a 40 wt % solution in toluene and having about 69% by weight chlorine content.
**Polymethyl methacrylate: high molecular compound having $[n]_{methyl\ ethyl\ ketone}^{30°C.}$ of 0.282 of the limiting viscosity at 30° C. as a solution in methyl ethyl ketone.

Components described in the tables were put in a container and dissolved by stirring for 3 hours to produce a homogeneous solution. The resulting solution was applied to an aluminium plate having a thickness of 0.24 mm, the surface of which was grained in a conventional method and subjected to anodic oxidation by a spinner (rotary application apparatus) and dried at 80° C. for 10 minutes to form a photosensitive layer. The thickness of the photosensitive layer after drying was about 10μ.

(2) Measurement of Sensitivity

On the photosensitive layer of the photosensitive material, an optical wedge having a step difference of 0.15 optical density (the number of steps of optical density was 0 to 15, the minimum optical density was 0.10 and the maximum optical density was 2.30) was laid under a reduced pressure so as to obtain close contact. After being exposed imagewise for 15 seconds at 50 cm from the light source (ultra-high pressure mercury lamp, generating power: 2 kw), the photosensitive layer was developed by processing with 1,1,1-trichloroethane for 30 seconds. The maximum step number of the optical wedge corresponding to the resulting image is shown as the sensitivity. The fact that the step number is higher (the numerical value is larger) means that the sensitivity is higher.

Results obtained are set forth in Tables 2 to 5 together with the binders and compounds used as the photopolymerization initiator. In the tables, E designates the examples in accordance with the present invention and C designates the comparative examples.

TABLE 2

| | C-1 | C-2 | C-3 | E-1 | C-4 | E-2 | C-5 | E-3 | C-6 | E-4 | C-7 | E-5 | E-6 |
|---|---|---|---|---|---|---|---|---|---|---|---|---|---|
| Ethylenic compound (parts by weight) | 50 | 50 | 50 | 50 | 50 | 50 | 50 | 50 | 50 | 50 | 50 | 50 | 50 |
| Photopolymerization initiator (parts by weight) | | | | | | | | | | | | | |
| Component (a) | | | | | | | | | | | | | |
| 3-Phenyl-5-isoxazolone | 5 | — | — | 3 | — | 3 | — | 3 | — | 3 | — | 3 | — |
| 4-Ethoxycarbonyl-5-isoxazolone | — | 5 | — | — | — | — | — | — | — | — | — | — | 3 |
| Component (b) | | | | | | | | | | | | | |
| Benzanthrone | — | — | 5 | 2 | — | — | — | — | — | — | — | — | 2 |
| Anthrone | — | — | — | — | 5 | 2 | — | — | — | — | — | — | — |
| 1,2-Benzo-9,10-anthraquinone | — | — | — | — | — | — | 5 | 2 | — | — | — | — | — |
| 2-Methyl-9,10-anthraquinone | — | — | — | — | — | — | — | — | 5 | 2 | — | — | — |
| Benzoin methyl ether | — | — | — | — | — | — | — | — | — | — | 5 | 2 | — |
| Binder (chlorinated polyethylene) | 45 | 45 | 45 | 45 | 45 | 45 | 45 | 45 | 45 | 45 | 45 | 45 | 45 |
| Sensitivity (step) | 3 | 1 | 1 | >15* | 0 | 13 | 3 | >15* | 3 | 9 | 1 | 7 | 7 |

*Sensitivity is so high that it cannot be measured under the above-described image exposure condition which is common in all examples.

TABLE 3

(No.1)

| | C-8 | E-7 | C-9 | E-8 | C-10 | E-9 | C-11 | E-10 | C-12 | E-11 | C-13 | E-12 | E-13 |
|---|---|---|---|---|---|---|---|---|---|---|---|---|---|
| Ethylenic compound (parts by weight) | 50 | 50 | 50 | 50 | 50 | 50 | 50 | 50 | 50 | 50 | 50 | 50 | 50 |

TABLE 3-continued (No.1)

|  | C-8 | E-7 | C-9 | E-8 | C-10 | E-9 | C-11 | E-10 | C-12 | E-11 | C-13 | E-12 | E-13 |
|---|---|---|---|---|---|---|---|---|---|---|---|---|---|
| Photopolymerization initiator (parts by weight) | | | | | | | | | | | | | |
| Component (a) | | | | | | | | | | | | | |
| 3-Phenyl-5-isoxazolone | — | 3 | — | 3 | — | 3 | — | 3 | — | 3 | — | 3 | — |
| 4-Ethoxycarbonyl-5-isoxazolone | — | — | — | — | — | — | — | — | — | — | — | — | 3 |
| Component (b) | | | | | | | | | | | | | |
| Compound (8) | 5 | 2 | — | — | — | — | — | — | — | — | — | — | 2 |
| Compound (15) | — | — | 5 | 2 | — | — | — | — | — | — | — | — | — |
| Compound (16) | — | — | — | — | 5 | 2 | — | — | — | — | — | — | — |
| Compound (17) | — | — | — | — | — | — | 5 | 2 | — | — | — | — | — |
| Compound (18) | — | — | — | — | — | — | — | — | 5 | 2 | — | — | — |
| Compound (19) | — | — | — | — | — | — | — | — | — | — | 5 | 2 | — |
| Binder (chlorinated polyethylene) | 45 | 45 | 45 | 45 | 45 | 45 | 45 | 45 | 45 | 45 | 45 | 45 | 45 |
| Sensitivity (step) | 7–8 | 14 | 3 | 7 | 3 | 8 | 3 | 7 | 4 | 12 | 0 | 5 | 12 |

TABLE 3 (No.2)

|  | C-14 | E-14 | C-15 | E-15 | C-16 | E-16 | C-17 | E-17 |
|---|---|---|---|---|---|---|---|---|
| Ethylenic Compound (parts by weight) | 50 | 50 | 50 | 50 | 50 | 50 | 50 | 50 |
| Photopolymerization initiator (parts by weight) | | | | | | | | |
| Component (a) | | | | | | | | |
| 3-Phenyl-5-isoxazolone | — | 3 | — | 3 | — | 3 | — | 3 |
| 4-Ethoxycarbonyl-5-isoxazolone | — | — | — | — | — | — | — | — |
| Component (b) | | | | | | | | |
| Compound (23) | 5 | 2 | — | — | — | — | — | — |
| Compound (24) | — | — | 5 | 2 | — | — | — | — |
| Compound (25) | — | — | — | — | 5 | 2 | — | — |
| 2-(α-Thioxophenetylidene)-3-methylnaphtho[1,2-d][1,3]-thiazoline | — | — | — | — | — | — | 5 | 2 |
| Binder (chlorinated polyethylene) | 45 | 45 | 45 | 45 | 45 | 45 | 45 | 45 |
| Sensitivity (step) | 4 | 13 | 1 | 12 | 5 | 12 | 1 | 6 |

TABLE 4 (No.1)

|  | C-18 | E-18 | C-19 | E-19 | C-20 | E-20 | C-21 | E-21 | C-22 | E-22 |
|---|---|---|---|---|---|---|---|---|---|---|
| Ethylenic compound (parts by weight) | 50 | 50 | 50 | 50 | 50 | 50 | 50 | 50 | 50 | 50 |
| Photopolymerization initiator (parts by weight) | | | | | | | | | | |
| Component (a) | | | | | | | | | | |
| 3-Phenyl-5-isoxazolone | — | 3 | — | 3 | — | — | — | — | — | — |
| 4-Ethoxycarbonyl-5-isoxazolone | — | — | — | — | — | — | — | — | — | — |
| Component (b) | | | | | | | | | | |
| p-Dimethylaminostyryl ethyl ketone | 5 | 2 | — | — | — | — | — | — | — | — |
| p-Dimethylaminochalcone | — | — | 5 | 2 | — | — | — | — | — | — |
| p'-Dimethylaminochalcone | — | — | — | — | 5 | 2 | — | — | — | — |
| p,p'-Bis(dimethylamino)-chalcone | — | — | — | — | — | — | 5 | 2 | — | — |
| p-Dimethylaminostyryl styryl ketone | — | — | — | — | — | — | — | — | 5 | 2 |
| Binder (chlorinated polyethylene) | 45 | 45 | 45 | 45 | 45 | 45 | 45 | 45 | 45 | 45 |
| Sensitivity (step) | 2 | 8 | 1 | 9 | 1 | 7 | 4 | 8 | 4 | 11 |

TABLE 4 (No.2)

|  | C-23 | E-23 | C-24 | E-24 | E-25 |
|---|---|---|---|---|---|
| Ethylenic compound (parts by weight) | 50 | 50 | 50 | 50 | 50 |
| Photopolymerization initiator (parts by weight) | | | | | |
| Component (a) | | | | | |
| 3-Phenyl-5-isoxazolone | — | 3 | — | 3 | — |
| 4-Ethoxycarbonyl-5-isoxazolone | — | — | — | — | 3 |
| Component (b) | | | | | |
| p-Dimethylaminostyryl m-chlorostyryl ketone | 5 | 2 | — | — | — |
| p-Diemthylaminostyryl p-methoxystyryl ketone | — | — | 5 | 2 | 2 |
| Binder (chlorinated polyethylene) | 45 | 45 | 45 | 45 | 45 |
| Sensitivity (step) | 5 | 13 | 5 | 12 | 8 |

TABLE 5

| | E-26 | E-27 | E-28 |
|---|---|---|---|
| Ethylenic compound (parts by weight) | 50 | 50 | 50 |
| Photopolymerization initiator (parts by weight) | | | |
| Component (a) | | | |
| 3-Phenyl-5-isoxazolone | 3 | 3 | 3 |
| 4-Ethoxycarbonyl-5-isoxazolone | — | — | — |
| Component (b) | | | |
| Benzanthrone | 2 | — | — |
| 1,2-Benzo-9,10-anthraquinone | — | 2 | — |
| Compound (15) | — | — | 2 |
| Binder (polymethyl methacrylate) | 45 | 45 | 45 |
| Sensitivity (step) | 15 | 14 | 11 |

It is understood from the results shown in Tables 2 to 5 that photosensitive materials using the photopolymerizable compositions of the present invention have the high sensitivity necessary to form images to the ultra-high pressure mercury lamp as compared with the Comparative Examples.

In the case of photosensitive materials using the photopolymerizable compositions containing chlorinated polyethylene as a binder shown in the Examples, when the polyethylene terephthalate film is strongly pressed against the photosensitive layer during preparation of the photosensitive material to produce a laminate, the unexposed parts of the photosensitive layer is removed together with the polyethylene terephthalate film and the polymerized and hardened exposed parts of the photosensitive layer remain on the aluminium plate to form images by stripping off the polyethylene terephthalate film after imagewise exposing the photosensitive material in an exposure sufficient to form images.

While the invention has been described in detail and with reference to specific embodiments thereof, it will be apparent to one skilled in the art that various changes and modifications can be made therein without departing from the spirit and scope thereof.

What is claimed is:

1. In a photopolymerizable composition comprising (1) an addition-polymerizable compound having at least one ethylenically unsaturated double bond and (2) a photopolymerization initiator as essential components, the improvement which comprises said photopolymerization initiator comprising a combination of (a) a 5-isoxazolone represented by the general formula (1) and (b) an aromatic carbonyl compound, a dialkylamino aromatic carbonyl compound represented by any of formulae (2) to (5), a compound represented by the formula (6) or 2-(α-thioxophenetylidene)-3-methylnaphtho[1,2-d][1,3]thiazoline:

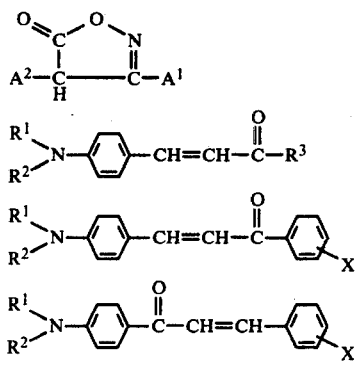

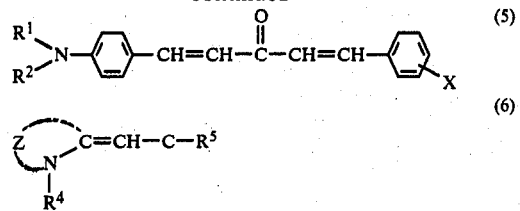

wherein in the formula (1) $A^1$ and $A^2$ each represent an alkyl group, an alkylcarbonyl group, an alkoxycarbonyl group, an aryl group, an arylcarbonyl group or a hydrogen atom and may be the same or different; in formulae (2) to (5) $R^1$ and $R^2$ each represent an alkyl group and may be the same or different, $R^3$ represents an alkyl group, an aryl group, an aralkyl group, an alkoxy group, an aryloxy group or a 5- or 6-membered heteroaromatic ring, and X represents a substituent having a Hammett's $\sigma$ value in the range of about $-0.9$ to $+0.7$; and in the formula (6) $R^4$ represents an alkyl group or an alkenyl group, $R^5$ represents an alkyl group, an aryl group, a thienyl group or a furyl group, and Z represents an atomic group necessary to form a nitrogen containing heterocyclic ring.

2. The photopolymerizable composition of claim 1 which additionally contains (3) a polymer having film-forming ability and compatibility with the components (1) and (2) as a binder.

3. The photopolymerizable composition of claims 1 or 2, wherein component (a) is 3-phenyl-5-isoxazolone or 4-ethoxycarbonyl-5-isoxazolone.

4. The photopolymerizable composition of claims 1 or 2, wherein component (b) is an aromatic carbonyl compound.

5. The photopolymerizable composition of claim 4, wherein the aromatic carbonyl compound is a benzanthrone or an anthrone.

6. The photopolymerizable composition of claim 4, wherein the aromatic carbonyl compound is 1,2-benzo-9,10-anthraquinone or 2-methyl-9,10-anthraquinone.

7. The photopolymerizable composition of claims 1 or 2, wherein component (b) is a dialkylamino aromatic carbonyl compound represented by any of the formulae (2) to (5).

8. The photopolymerizable composition of claim 7, wherein the dialkylamino aromatic carbonyl compound is a compound having a p-dialkylaminocinnamoyl group represented by the formula (2).

9. The photopolymerizable composition of claim 7, wherein the dialkylamino aromatic carbonyl compound is a p-dialkylaminochalcone derivative represented by the formula (3).

10. The photopolymerizable composition of claim 9, wherein the p-dialkylaminochalcone derivative is p-dimethylaminochalcone.

11. The photopolymerizable composition of claim 7, wherein the dialkylamino aromatic carbonyl compound is a chalcone derivative represented by the formula (4).

12. The photopolymerizable composition of claim 7, wherein the dialkylamino aromatic carbonyl compound is p-dialkylaminostyryl styryl ketone derivative represented by the formula (5).

13. The photopolymerizable composition of claim 12, wherein the p-dialkylaminosytyrl styryl ketone derivative is p-dimethylaminostyryl styryl ketone, p-dimethylaminostyryl m-chlorostyryl ketone or p-dimethylaminostyryl p-methoxystyryl ketone.

14. The photopolymerizable composition of claims 1 or 2, wherein component (b) is a compound represented by the formula (6).

15. The photopolymerizable composition of claim 14, wherein the compound represented by the formula (6) is

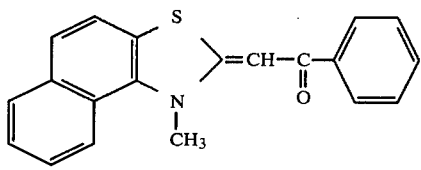

16. The photopolymerizable composition of claim 14, wherein the compound represented by the formula (6) is

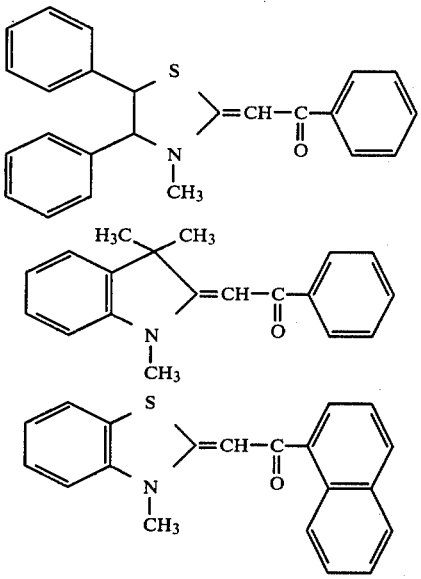

17. The photopolymerizable composition of claims 1 or 2, wherein component (b) is 2-(α-thioxophenetylidene)-3-methylnaphtho[1,2-d][1,3]thiazoline.

18. The photopolymerizable composition of claims 1 or 2, wherein said 5-isoxazolone is selected from the group consisting of 3-methyl-3-phenyl-5-isoxazolone, 5-isoxazolone, 3-ethyl-5-isoxazolone, 3-acetyl-5-isoxazolone and 4-ethoxycarbonyl-5-isoxazolone.

19. The photopolymerizable composition of claim 4, wherein said aromatic carbonyl compound contains one or two oxo-oxygen atoms.

20. The photopolymerizable composition of claim 4, wherein said aromatic carbonyl compound is an aromatic acyloin, an aromatic acyloin ether, an aromatic ketone or a polynuclear condensation type quinone.

21. The photopolymerizable composition of claim 20, wherein said quinone is an anthraquinone or a phenanthraquinone.

22. The photopolymerizable composition of claims 1 or 2, wherein X is selected from the group consisting of a hydrogen atom, a methyl group, an ethyl group, a methoxy group, an ethoxy group, a dimethylamino group, a diethylamino group, a chlorine atom, a bromine atom and a cyano group.

23. The photopolymerizable composition of claim 8, wherein said compound of the formula (2) is selected from the group consisting of p-dimethylaminostyryl methyl ketone, p-dimethylaminostyryl ethyl ketone, p-dimethylaminostyryl propyl ketone, p-dimethylaminostyryl butyl ketone, p-dimethylaminostyryl isobutyl ketone, p-dimethylaminostyryl tert-butyl ketone, p-dimethylaminostyryl cyclohexyl ketone, p-dimethylaminostyryl phenetyl ketone, methyl p-dimethylaminocinnamate, ethyl p-dimethylaminocinnamate, p-dimethylaminostyryl 2-pyridyl ketone, p-dimethylaminostyryl 4-pyridyl ketone, p-dimethylaminostyryl 2-thienyl ketone, and p-dimethylaminostyryl 9-anthryl ketone.

24. The photopolymerizable composition of claim 9, wherein said compound of the formula (3) is selected from the group consisting of p-dimethylaminochalcone, p-dimethylamino-m'-chlorochalcone, p-dimethylamino-p'-chlorochalcone, p-dimethylamino-m'-bromochalcone, p-dimethylamino-p'-bromochalcone, p-dimethylamino-p'-cyanochalcone, p-dimethylamino-p'-methoxychalcone, p-dimethylamino-p'-methylchalcone, p-dimethylamino-m'-methylchalcone, p-dimethylamino-p'-ethylchalcone, p-dimethylamino-m'-ethylchalcone, p-diethylamino-p'-bromochalcone, p-diethylamino-m'-bromochalcone, p-diethylamino-p'-chlorochalcone and p-diethylamino-m'-chlorochalcone.

25. The photopolymerizable composition of claim 11, wherein said compound represented by the formula (4) is selected from the group consisting of p'-dimethylaminochalcone, p-cyano-p'-dimethylaminochalcone, m-chloro-p'-dimethylaminochalcone, p-chloro-p'-dimethylaminochalcone, m-bromo-p'-dimethylaminochalcone, p-bromo-p'-dimethylaminochalcone, m-methyl-p'-dimethylaminochalcone, p-methyl-p'-dimethylaminochalcone, p-ethyl-p'-dimethylaminochalcone, m-ethyl-p'-dimethylaminochalcone, p-ethyl-p'-dimethylaminochalcone, p-methoxy-p'-dimethylaminochalcone and p,p'-bis(dimethylamino)chalcone.

26. The photopolymerizable composition of claim 12, wherein said compound represented by the formula (5) is selected from the group consisting of p-dimethylaminostyryl p-methylstyryl ketone, p-dimethylaminostyryl p-ethylstyryl ketone, p-dimethylaminostyryl p-chlorostyryl ketone, p-dimethylaminostyryl m-chlorostyryl ketone, p-dimethylaminostyryl p-bromostyryl ketone, p-dimethylaminostyryl m-bromostyryl ketone, p-dimethylaminostyryl p-methoxystyryl ketone, p-dimethylaminostyryl p-ethoxystyryl ketone, p-dimethylaminostyryl p-cyanostyryl ketone, p-dimethylaminostyryl m-methylstyryl ketone, p-dimethylaminostyryl m-ethylstyryl ketone, bis(p-dimethylaminostyryl)ketone and bis(p-diethylaminostyryl)ketone.

27. The photopolymerizable composition of claims 1 or 2, wherein the weight ratio of compound (a) to compound (b) is about 1:30 to about 30:1.

28. The photopolymerizable composition of claims 1 or 2, wherein said component (2) is present in an amount of about 0.1 to 20% by weight based on the weight of said ethylenic compound (1).

29. The photopolymerizable composition of claim 2, wherein said composition is developable by stripping, by water, or by a weak aqueous alkali solution.

30. The photopolymerizable composition of claim 2, wherein said polymer is present in an amount of about 10% to about 50% by weight based on the weight of said ethylenic compound (1).

31. The photopolymerizable composition of claim 1, wherein in Formula I the alkyl group represented by $A^1$ and $A^2$ is a straight or branched chain alkyl group having 1 to 5 carbon atoms, the alkyl carbonyl group has 2 to 6 carbon atoms, the alkoxy carbonyl group is one in which the alkyl group is straight or branched chain having 1 to 5 carbon atoms, the aryl group is phenyl, p-tolyl, m-tolyl or o-tolyl and the arylcarbonyl group is benzoyl, m-tolyoly or o-tolyoly.

* * * * *